US009818870B2

United States Patent
Rachmady et al.

(10) Patent No.: US 9,818,870 B2
(45) Date of Patent: Nov. 14, 2017

(54) TRANSISTOR STRUCTURE WITH VARIABLE CLAD/CORE DIMENSION FOR STRESS AND BANDGAP

(71) Applicant: Intel Corporation, Santa Clara, CA (US)

(72) Inventors: Willy Rachmady, Beaverton, OR (US); Van H. Le, Portland, OR (US); Ravi Pillarisetty, Portland, OR (US); Marko Radosavljevic, Beaverton, OR (US); Gilbert Dewey, Hillsboro, OR (US); Niloy Mukherjee, Portland, OR (US); Jack T. Kavalieros, Portland, OR (US); Robert S. Chau, Beaverton, OR (US); Benjamin Chu-Kung, Portland, OR (US); Roza Kotlyar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/914,847

(22) PCT Filed: Sep. 27, 2013

(86) PCT No.: PCT/US2013/062468
§ 371 (c)(1),
(2) Date: Feb. 26, 2016

(87) PCT Pub. No.: WO2015/047349
PCT Pub. Date: Apr. 2, 2015

(65) Prior Publication Data
US 2016/0240671 A1    Aug. 18, 2016

(51) Int. Cl.
*H01L 29/78*    (2006.01)
*H01L 29/66*    (2006.01)
(Continued)

(52) U.S. Cl.
CPC ........ *H01L 29/7842* (2013.01); *H01L 29/068* (2013.01); *H01L 29/0665* (2013.01);
(Continued)

(58) Field of Classification Search
CPC ........... H01L 29/7842; H01L 29/78696; H01L 29/42392; H01L 29/068; H01L 29/512;
(Continued)

(56) References Cited

U.S. PATENT DOCUMENTS 5,479,033 A * 12/1995 Baca .................. H01L 29/802
257/192
5,650,642 A *  7/1997 Sawada ............... H01L 29/7783
257/192

(Continued)

FOREIGN PATENT DOCUMENTS

EP       0477515       7/1995
TW       201312751     3/2013

OTHER PUBLICATIONS

Intel Corporation, International Search Report and Written Opinion for PCT/US2013/062468 (dated Jun. 19, 2014).
(Continued)

*Primary Examiner* — Jarrett Stark
(74) *Attorney, Agent, or Firm* — Schwabe Williamson & Wyatt P.C.

(57) ABSTRACT

An apparatus including a heterostructure disposed on a substrate and defining a channel region, the heterostructure including a first material having a first band gap less than a band gap of a material of the substrate and a second material having a second band gap that is greater than the first band gap; and a gate stack on the channel region, wherein the second material is disposed between the first material and the gate stack. A method including forming a first material having a first band gap on a substrate; forming a second
(Continued)

material having a second band gap greater than the first band gap on the first material; and forming a gate stack on the second material.

10 Claims, 5 Drawing Sheets

(51) Int. Cl.
    *H01L 29/775*     (2006.01)
    *H01L 29/778*     (2006.01)
    *H01L 29/10*     (2006.01)
    *H01L 29/06*     (2006.01)
    *H01L 29/16*     (2006.01)
    *H01L 29/20*     (2006.01)
    *H01L 29/51*     (2006.01)
    *H01L 29/165*     (2006.01)
    *H01L 29/423*     (2006.01)
    *H01L 29/786*     (2006.01)

(52) U.S. Cl.
    CPC ...... *H01L 29/0673* (2013.01); *H01L 29/1054* (2013.01); *H01L 29/16* (2013.01); *H01L 29/165* (2013.01); *H01L 29/20* (2013.01); *H01L 29/42392* (2013.01); *H01L 29/512* (2013.01); *H01L 29/66439* (2013.01); *H01L 29/66568* (2013.01); *H01L 29/775* (2013.01); *H01L 29/778* (2013.01); *H01L 29/78696* (2013.01)

(58) Field of Classification Search
    CPC .............. H01L 29/165; H01L 29/0673; H01L 29/66568; H01L 29/0665; H01L 29/20; H01L 29/16; H01L 29/66439; H01L 29/1054; H01L 29/07
    See application file for complete search history.

(56) References Cited

U.S. PATENT DOCUMENTS

| | | | | |
|---|---|---|---|---|
| 7,728,387 | B1* | 6/2010 | Krishnamohan | H01L 29/78 257/217 |
| 7,928,426 | B2* | 4/2011 | Chui | H01L 29/1054 257/24 |
| 8,178,946 | B1 | 5/2012 | Li et al. | |
| 8,183,556 | B2* | 5/2012 | Dattà | H01L 21/823807 257/14 |
| 8,455,860 | B2* | 6/2013 | Ko | H01L 29/41775 257/192 |
| 2006/0267007 | A1* | 11/2006 | Salzman | B82Y 20/00 257/46 |
| 2008/0191196 | A1* | 8/2008 | Lu | B82Y 10/00 257/27 |
| 2008/0296622 | A1 | 12/2008 | Kiewra et al. | |
| 2009/0004881 | A1* | 1/2009 | Chen | H01L 29/66772 438/763 |
| 2009/0242873 | A1 | 10/2009 | Pillarisetty et al. | |
| 2011/0254010 | A1 | 10/2011 | Zhang | |
| 2013/0056795 | A1* | 3/2013 | Wu | H01L 29/66795 257/191 |

OTHER PUBLICATIONS

Intel Corporation, Taiwanese Office Action and Search Report for Application No. 103132437 (dated Nov. 18, 2015).
Intel Corporation, International Preliminary Report on Patentability for PCT/US2013/062468 (dated Apr. 7, 2016).

* cited by examiner

TRANSISTOR STRUCTURE WITH VARIABLE CLAD/CORE DIMENSION FOR STRESS AND BANDGAP

CROSS-REFERENCE TO RELATED APPLICATION

This patent application is a U.S. National Phase Application under 35 U.S.C. §371 of International Application No. PCT/US2013/062468, filed Sep. 27, 2013, entitled TRANSISTOR STRUCTURE WITH VARIABLE CLAD/CORE DIMENSION FOR STRESS AND BAND GAP MODULATION.

FIELD

Semiconductor devices including non-planar semiconductor devices having channel regions with low band gap cladding layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed from group III-V compound semiconductor material systems offer exceptionally high carrier mobility in the transistor channels due to low effective mass along with reduced impurity scattering. Group III and group V refer to a location of the elements of the semiconductor material in groups 13-15 of the Periodic Table of Elements (formerly groups III-V). Such devices provide high drive current performance and appear promising for future low power, high-speed logic applications. To integrate such materials on a silicon substrate, buffer layer(s) of relatively wider band gap material are typically introduced between the silicon and the group III-V compound channel material to confine carriers to the channel material and achieve short channel effects in the buffer layer(s).

DETAILED DESCRIPTION

Semiconductor devices with variable clad and core dimensions for stress and band gap modulation are described. In one embodiment, a transistor device is described with a first clad/core dimension in the channel and a second different clad/core dimension in the junction regions (e.g., source and drain regions). By varying the clad/core dimensions, a path is provided to achieve high mobility in the channel and a low contact resistance in the junction regions. One way the clad/core dimension varies is by varying a ratio of cladding material relative to core material (e.g., varying a volume ratio). Varying a ratio of the cladding material and the core material modulates a stress transfer between the materials. In one embodiment, a core material cross-section width is varied in such a way that a cladding material, which is a conducting layer for a transistor, has increased stress in the junction regions (source and drain regions) than in the channel. A high stress in a cladding layer will lead to band gap narrowing and therefore lowers a contact barrier between the junction regions and associated contact metal.

The techniques described enable direct integration of high mobility semiconductor materials such as germanium (Ge) and group III-IV compound semiconductor materials on silicon and take advantage of band gap narrowing due to stress to lower device external resistance.

Semiconductor devices include a device incorporating a gate, a channel region and junction regions (source and drain regions). In an embodiment, a semiconductor device is one such as but not limited to a metal oxide semiconductor field effect transistor (MOSFET) or a microelectromechanical system (MEMS) device. In one embodiment, a semiconductor device is a three-dimensional MOSFET and is an isolated device or is one device in a number of nested devices. As will be appreciated for an integrated circuit, both N- and P-channel transistors may be fabricated on a single substrate to form a complimentary metal oxide semiconductor (CMOS) integrated circuit. Further, additional interconnect may be fabricated in order to integrate such device into an integrated circuit.

Figure 1:
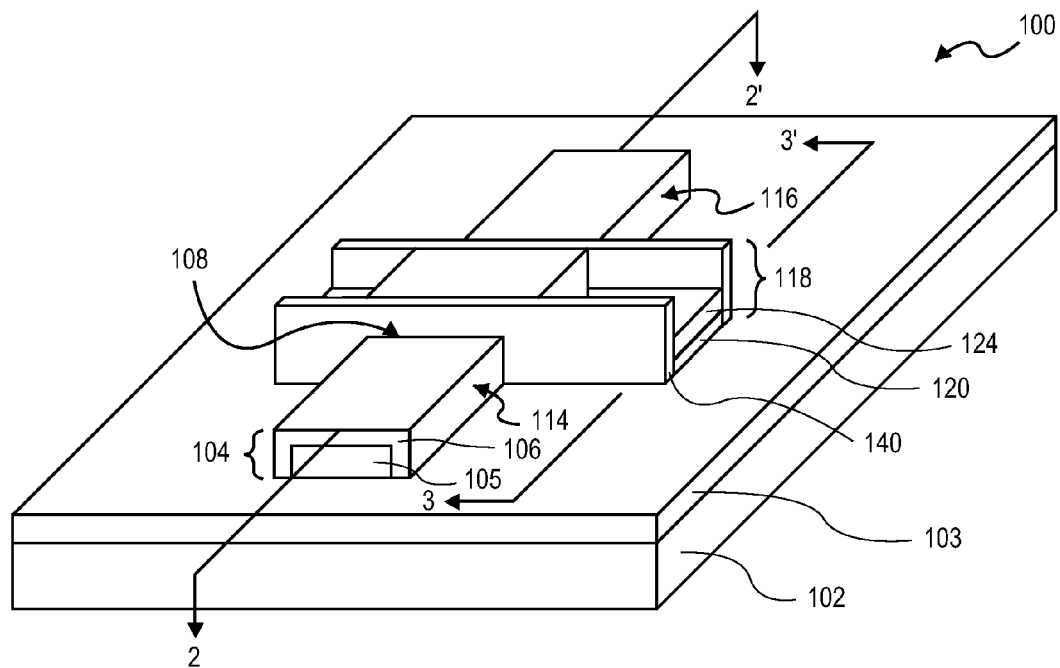
FIG. 1 shows a top perspective view of one embodiment of a three-dimensional transistor structure.

FIG. 1 shows a top perspective view of one embodiment of a three-dimensional transistor structure. In FIG. 1, the transistor structure incorporates a cladding layer on a nanoribbon core. It is appreciated that the techniques and improvements described are applicable to not only nanoribbon or nanostructure core devices, but to other devices, including, but not limited to, trigate transistor devices.

Referring to FIG. 1, structure 100 includes substrate 102. Substrate 102 may be composed of a material suitable for semiconductor device fabrication. In one embodiment, substrate 102 is a bulk substrate composed of a single crystal of a material that may include, but is not limited to, silicon, germanium, silicon-germanium or a group III-V compound semiconductor material. In the embodiment shown in FIG. 1, insulator layer 103 is disposed on substrate 102. Insulator layer 103 is, for example, a material that may include, but is not limited to, silicon dioxide, silicon nitride or silicon oxynitride. Disposed on insulator layer 103 is nanoribbon 104. Nanoribbon 104 is a heterostructure including core material 105 and cladding material 106. In one embodiment, core material 105 is a single crystal semiconductor material such as silicon and cladding material 106 is a semiconductor material having a lower band gap than core material 105. Representative examples of a material for cladding material 106 include germanium or group III-V compound semiconductor materials. Nanoribbon 104 defines a three-dimensional body with channel 108 and source and drain regions 114/116 formed on opposite sides of channel 108. Overlying channel 108 is gate stack 118 including gate electrode 124 and gate dielectric 120. Spacers 140 are illustrated on opposite sides of gate stack 118.

In one embodiment, gate stack 118 completely surrounds channel region 108. In such an embodiment, cladding material 106 may completely surround core material 105. In another embodiment, gate stack 118 only partially surrounds channel region 108 and cladding material 106 may also only partially surround core material 105.

In one embodiment, gate electrode 124 of gate stack 118 is composed of a metal gate and gate dielectric 120 is composed of a material having a dielectric constant greater than a dielectric constant of silicon dioxide (a high-k material). Representative materials for gate dielectric 120 include, but are not limited to, hafnium oxide, hafnium oxynitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Representative materials for gate electrode 124 include, but are not limited to, metal nitrides, metal carbides, metal silicides, metal aluminides, hafnium, zirconium, titanium, tantalum, aluminum, ruthenium, palladium, platinum, cobalt, nickel, and conductive metal oxides.

Figure 2:
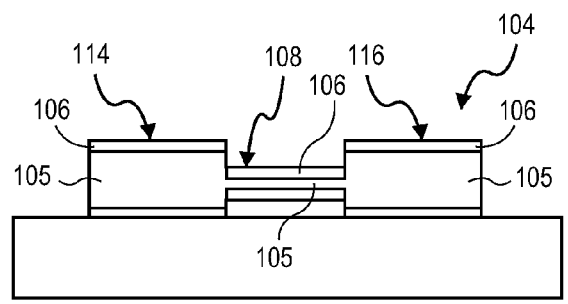
FIG. 2 shows a cross-sectional side view of the structure of FIG. 1 through line 2-2'.
Figure 3:
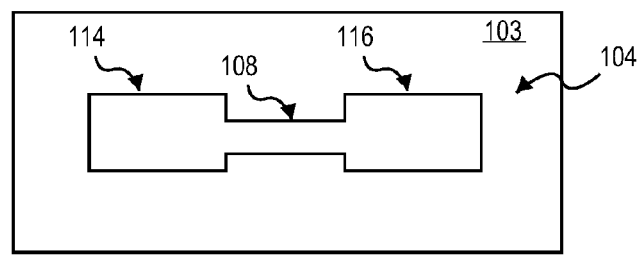
FIG. 3 shows a cross-sectional view of the structure of FIG. 1 through line 3-3'.

FIG. 2 shows a cross-sectional side view of structure 100 through line 2-2'. Specifically, FIG. 2 shows nanoribbon 104. In this view, gate stack 118 is omitted, as are spacers 140. FIG. 3 shows a cross-sectional view of the structure of FIG. 1 through line 3-3' of FIG. 1. FIG. 3 illustrates a top view of nanoribbon 104 with gate stack 118 and spacers 140 omitted. As illustrated in both FIG. 2 and FIG. 3, a volume of channel 108 is less than a volume of source and drain regions 114/116. The reduced volume channel is desirable to improve stress transfer between the cladding layer and the core. The reduced volume channel is also beneficial for device electrostatic control. In one embodiment, a size (e.g., volume) of a channel and that of source and drain regions are independently set by the requirement in the required stress transfer for each region.

In one embodiment, the amount of stress between cladding material 106 and core material 105 in nanoribbon 104 is varied between the source and drain regions 114/116 and channel region 108. In a channel region, in one embodiment, there is a desire for high mobility. Imparting a stress or strain in cladding material 106 in channel region 108 will increase mobility. In an embodiment where core material 105 is silicon and cladding material 106 is germanium, one way of imparting a stress in cladding material 106 in channel region 108 is through the interaction of cladding material with the core material. FIG. 2 shows channel region 108 having a volume or amount of cladding material 106 that is greater than an amount of core material 105. The greater amount of the cladding material (e.g., germanium) will cause the core material (e.g., silicon) to comply with a lattice structure of the cladding material. In other words, for a core material of silicon, the silicon atoms will line up with a lattice of germanium atoms. In one embodiment, in channel region 108, a volume or amount of cladding material is equal to two times the volume or amount of core material. Such volume or amount will produce some stress transfer to cladding material 106, which is enough to increase carrier mobility (e.g., hole mobility).

In contrast to channel region 108, as shown in FIG. 2, in one embodiment, source and drain regions 114/116 have more core material relative to cladding material. In one embodiment, core material 105 in source and drain regions 114/116 is twice the volume or amount of cladding material 106 in the regions. An increase of the core material relative to the cladding material will tend to strain the cladding material, lowering its band gap.

Figure 4:
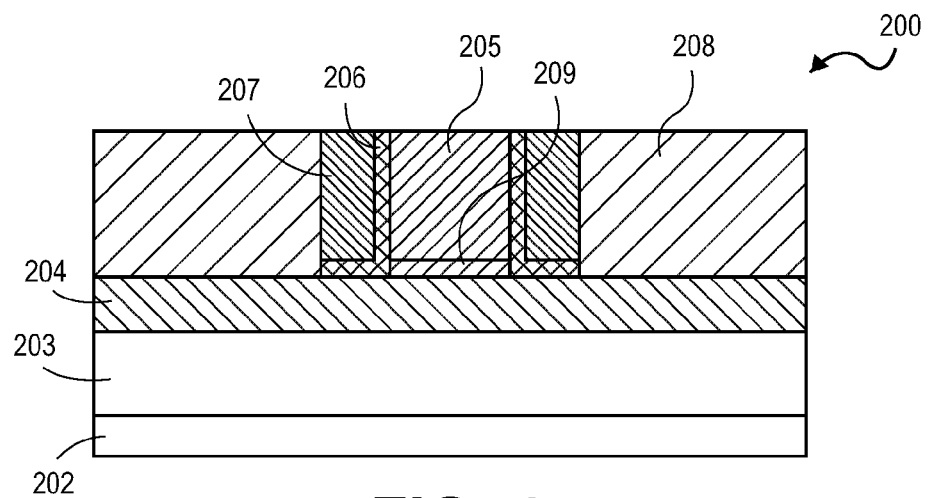
FIG. 4 is a cross-sectional view of a portion of a semiconductor on insulator structure (nanoribbon) including a dummy gate and spacer layers surrounding the gate.

FIGS. 4-12 describe one embodiment for forming the structure illustrated in FIG. 1. Referring to FIG. 4, FIG. 4 is a cross-sectional view of a portion of a structure. Structure 200 includes substrate 202 of, for example, a bulk substrate of a single crystal material such as silicon. Overlying substrate 202 is insulator or dielectric material 203 of, for example, silicon dioxide. Nanoribbon 204 of, for example, a single crystal semiconductor material such as silicon is disposed on insulator or dielectric material 203. Nanoribbon 204 may be formed from a blanket epitaxial layer. Representatively, an area for a nanoribbon may be masked and unwanted material removed to leave the nanoribbon. Disposed on nanoribbon 204 is dummy gate 205 of, for example, polysilicon and first spacer 206 and second spacer 207 disposed around dummy gate 205. Spacers 206 and 207 are selected of materials that can be selectively etched one relative to the other. Examples include silicon dioxide ($SiO_2$), silicon nitride ($Si_3N_4$) and silicon carbon nitride (SiCN). Adjacent dummy gate 205 and spacers 206 and 207 is dielectric layer 208 of, for example, silicon dioxide. In one embodiment, spacer 206 and spacer 207 are selected of a material that can be selectively etched relative to a material for dielectric layer 208. In the embodiment shown in FIG. 4, dummy gate 205 is disposed on oxide layer 209.

Figure 5:
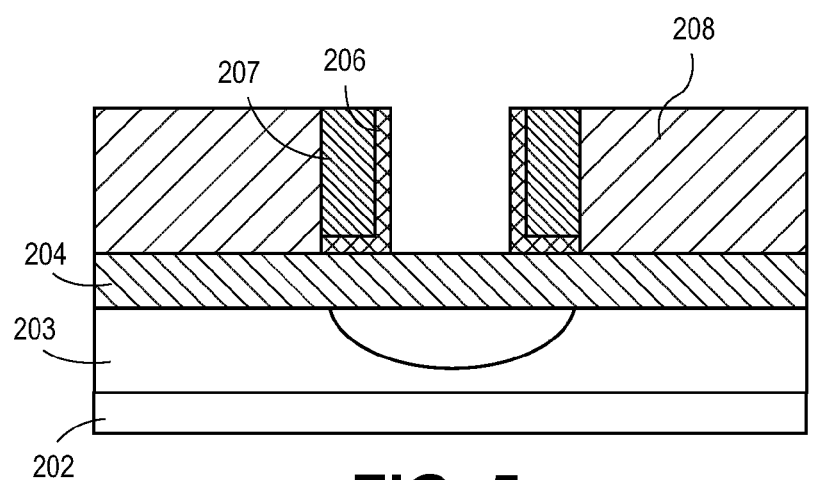
FIG. 5 shows the structure of FIG. 4 following the removal of the dummy gate.

FIG. 5 shows the structure of FIG. 4 following the removal of the dummy gate 205 and underlying oxide layer 209. Dummy gate 205 of, for example, polysilicon, is removed by an etch, such as a tetramethylammonium hydroxide (TMAH) followed, if necessary, by hydrofluoric acid (HF) etch to remove the oxide layer. Following the removal of dummy gate 205 and oxide layer 209, a portion of nanoribbon 204 corresponding to a portion of a channel region is exposed. Insulator or dielectric material 203 underlying the exposed portion of the channel region may be removed by selectively etching the insulator or dielectric material 203 relative to nanoribbon 204. In one embodiment, insulator or dielectric material 203 of silicon dioxide may be selectively etched using am HF etchant.

Figure 6:
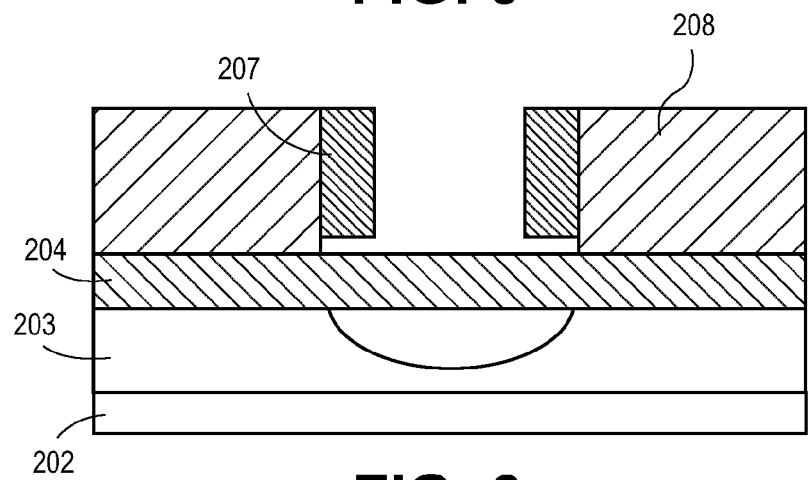
FIG. 6 shows the structure of FIG. 5 following the removal of one of the spacer layers that surrounded the dummy gate.

FIG. 6 shows the structure of FIG. 5 following a removal of spacer 206. Spacer 206 of an $SiO_2$ material may be selectively removed using, for example, an HF etchant.

Figure 7:
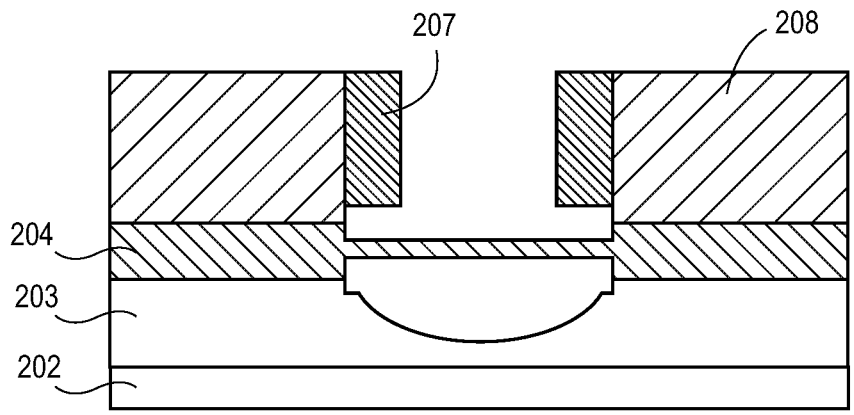
FIG. 7 shows the structure of FIG. 6 following the thinning of a channel region of a nanoribbon.

FIG. 7 shows the structure of FIG. 6 following the thinning of a channel region of a nanoribbon 204. In one embodiment, the channel may be thinned relative to the remainder of the nanoribbon by sacrificial oxidation of the semiconductor material of the nanoribbon.

Figure 8:
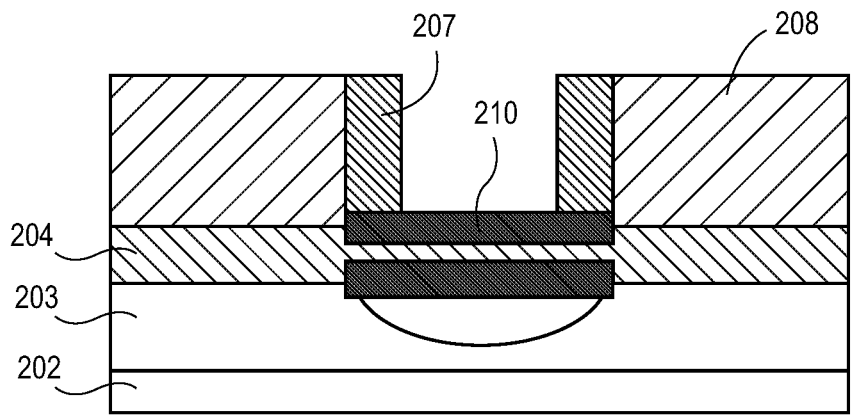
FIG. 8 shows the structure of FIG. 7 following the introduction of cladding material on the nanoribbon in a channel region.

FIG. 8 shows the structure of FIG. 7 following the introduction of cladding material on nanoribbon 204 in a channel region. In one embodiment, where nanoribbon 204 is a silicon material, cladding material 210 is, for example, germanium or a group III-V compound semiconductor material.

Figure 9:
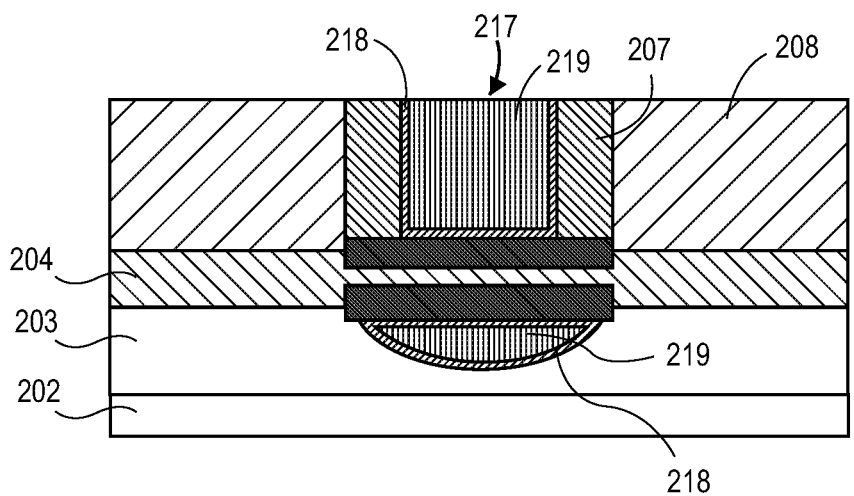
FIG. 9 shows the structure of FIG. 8 following the introduction of a gate stack on the channel region.

FIG. 9 shows the structure of FIG. 8 following the introduction of a gate stack on the channel region. In one embodiment, gate stack 217 includes high-k dielectric material 218 disposed on the channel material and metal gate material 219 disposed on the dielectric material. As shown in FIG. 9, the opening or releasing of nanoribbon from underlying insulator or dielectric layer 203 allows gate stack 217 to completely surround the channel region.

Figure 10:
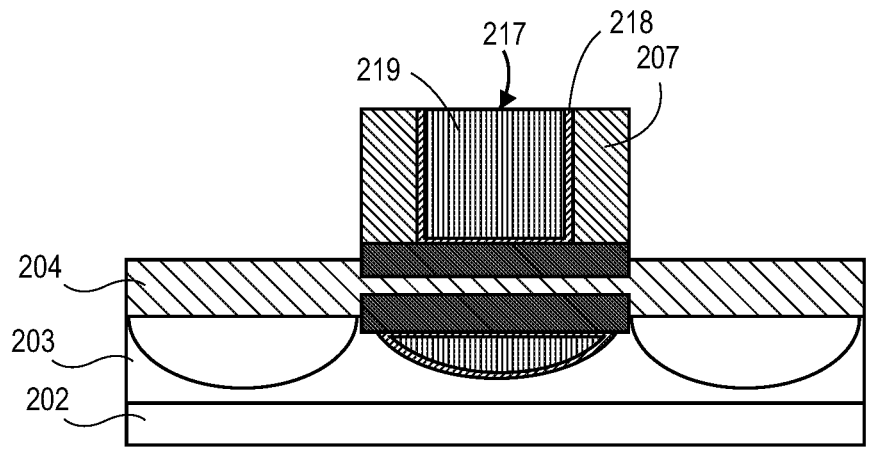
FIG. 10 shows the structure of FIG. 9 following the release of the nanoribbon from underlying insulator or dielectric layer in designated junction regions (source/drain regions).

FIG. 10 shows the structure of FIG. 9 following the release of the nanoribbon 204 from underlying insulator or dielectric layer 203 in designated junction regions (source/drain regions). One way this may be achieved is by etching dielectric layer 208 to expose nanoribbon 204 in the junction regions and then selectively etching insulator or dielectric layer 203 relative to the nanoribbon material.

Figure 11:
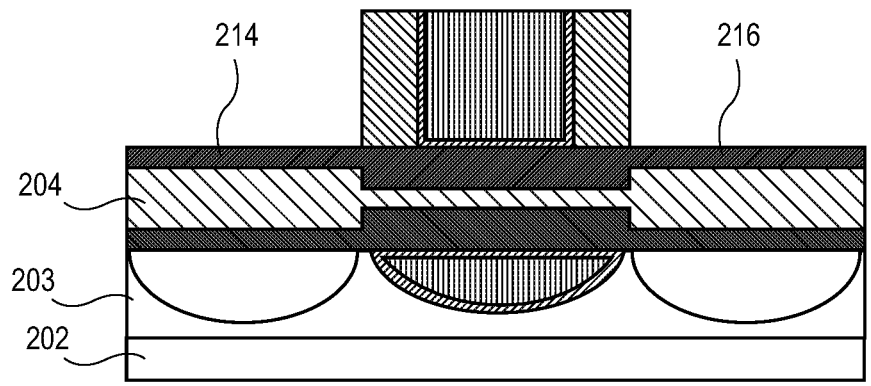
FIG. 11 shows the structure of FIG. 10 following the introduction of cladding material to the nanoribbon in the junction regions and the formation of source region and drain region.

FIG. 11 shows the structure of FIG. 10 following the introduction of cladding material to the nanoribbon in the junction regions and the formation of source region 214 and drain region 216.

Figure 12:
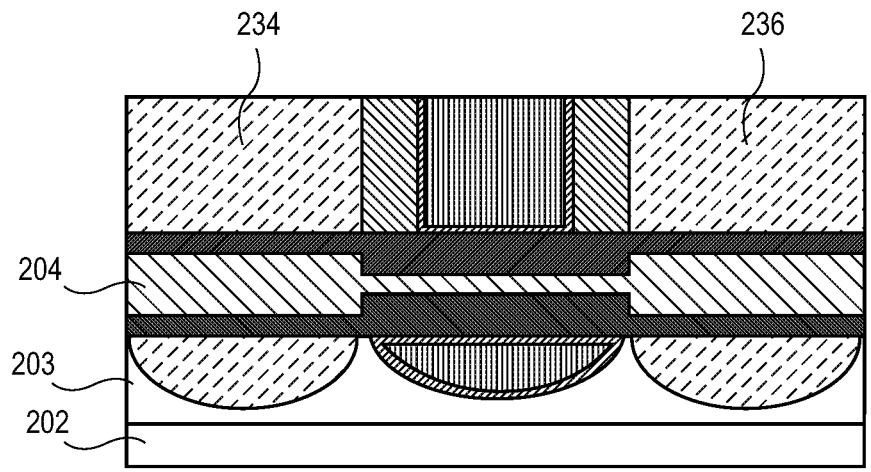
FIG. 12 shows the structure of FIG. 11 following the introduction of contacts to source and drain regions.
Figure 13:
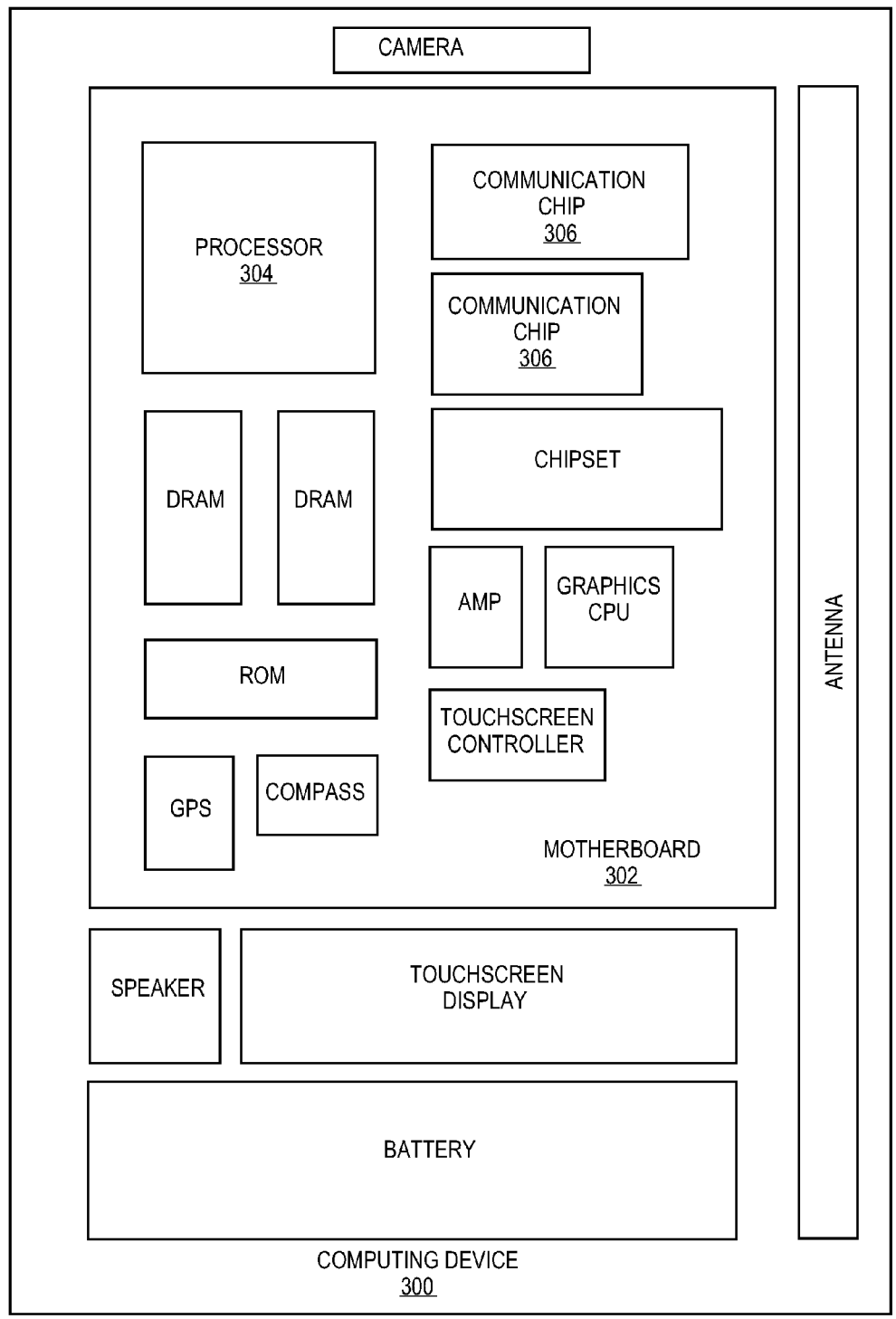
FIG. 13 illustrates a computing device in accordance with one implementation.

FIG. 12 shows the structure of FIG. 11 following the introduction of contacts to source region 214 and drain region 216, respectively. FIG. 12 shows contact metal 234 of, for example, titanium and tungsten surrounding source region 214 and contact metal 235 surrounding drain region 216. FIG. 13 illustrates a computing device 300 in accordance with one implementation.

Computing device 300 houses board 302. Board 302 may include a number of components, including but not limited to processor 304 and at least one communication chip 306. Processor 304 is physically and electrically coupled to board 302. In some implementations at least one communication chip 306 is also physically and electrically coupled to board 302. In further implementations, communication chip 306 is part of processor 304.

Depending on its applications, computing device 300 may include other components that may or may not be physically and electrically coupled to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, first communication chip 306 may be dedicated to shorter range wireless communications such as Wi-Fi and Bluetooth and second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations of the invention, the integrated circuit die of the processor includes one or more devices, such as MOSFET transistors built in accordance with implementations of the invention. The term "processor" may refer to any device or portion of a device that processes electronic data from registers and/or memory to transform that electronic data into other electronic data that may be stored in registers and/or memory.

Communication chip 306 also includes an integrated circuit die packaged within communication chip 306. In accordance with another implementation of the invention, the integrated circuit die of the communication chip includes one or more devices, such as MOSFET transistors built in accordance with implementations of the invention.

In further implementations, another component housed within computing device 300 may contain an integrated circuit die that includes one or more devices, such as MOSFET transistors built in accordance with implementations of the invention.

In various implementations, computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

EXAMPLES

Example 1 is an apparatus including a heterostructure disposed on a substrate and defining a channel region, the heterostructure including a first material having a first band gap less than a band gap of a material of the substrate and a second material having a second band gap that is greater than the first band gap; and a gate stack on the channel region, the gate stack including a dielectric material and a gate electrode on the dielectric material, wherein the second material is disposed between the first group III-V material and the gate stack.

In Example 2, the first material in the apparatus of Example 1 includes a binary group III-V semiconductor material.

In Example 3, the first material in the apparatus of Example 1 includes InAs.

In Example 4, the second material in the apparatus of Example 1 is a ternary group III-V semiconductor material.

In Example 5, a transition between the first material and the second material in the apparatus of Example 1 is graded.

In Example 6, a transition between the first material and the second material in the apparatus of Example 1 is stepped.

In Example 7, the substrate in the apparatus of Example 1 includes a semiconductor material and an insulator layer on the semiconductor material.

Example 8 is a method of manufacturing a semiconductor apparatus including forming a first material having a first band gap on a substrate, the first band gap less than a band gap of a material of the substrate; forming a second group III-V material having a second band gap greater than the first band gap on the first binary group III-V material; and forming a gate stack on the second group III-V material.

In Example 9, the first group III-V material in the method of Example 8 includes a binary group III-V material.

In Example 10, the first group III-V material in the method of Example 8 is InAs.

In Example 11, the second group III-V material in the method of Example 8 is a ternary group III-V material.

In Example 12, a transition between the first group III-V material and the second group III-V material in the method of Example 8 is graded.

In Example 13, a transition between the first binary group III-V material and the second group III-V material in the method of Example 8 is stepped.

In Example 14, a semiconductor apparatus is formed by any of the methods of Examples 8-13.

Example 15 is a semiconductor apparatus including a transistor on a substrate, the transistor including a channel region on a portion of the substrate; a first material having a first band gap less than a band gap of the semiconductor material of the substrate and a second material having a second band gap that is greater than the first band gap; and a gate stack on the channel region, the gate stack including a dielectric material a gate electrode on the dielectric material, wherein the portion of the substrate associated with the channel region has a property to comply with a lattice structure of the first material.

In Example 16, the first material in the apparatus of Example 15 includes a binary group III-V semiconductor material.

In Example 17, the first material in the apparatus of Example 15 includes InAs.

In Example 18, the second material in the apparatus of Example 15 is a ternary group III-V semiconductor material.

In Example 19, a transition between the first material and the second material in the apparatus of Example 15 is graded.

In Example 20, a transition between the first material and the second material in the apparatus of Example 15 is stepped.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A transistor apparatus comprising:
   a channel region and junction regions on a substrate, the junction regions on opposite sides of the channel region, the channel region and the junction regions each comprising a core material having a first band gap and a cladding material on the core material and having a second band gap different than the first band gap,
   wherein the cladding material of the junction regions is more compliant than the cladding material of the channel region, and wherein the cladding material completely surrounds the core material in the channel region; and
   a gate stack disposed on the channel region, the gate stack comprising a gate dielectric and a gate electrode.

2. The apparatus of claim 1, wherein an amount of cladding material relative to an amount of core material is greater in the channel region than in the junction regions.

3. The apparatus of claim 1, wherein the cladding material comprises germanium and the core material comprises silicon.

4. The apparatus of claim 1, wherein the cladding material comprises a group III-V compound semiconductor material.

5. The apparatus of claim 1, wherein a stress between the cladding material and the core material of the junction regions is different than a stress between the cladding material and the core material of the channel region.

6. The apparatus of claim 5, wherein the stress in the cladding material of the junction regions is greater than a stress in the cladding material of the channel region.

7. A transistor apparatus comprising:
   a channel region and junction regions on a substrate, the junction regions on opposite sides of the channel region, the channel region and the junction regions each comprising a core material having a first band gap and a cladding material on the core material and having a second band gap different than the first band gap,
   wherein the cladding material of the junction regions is under a greater stress than the cladding material of the channel region, and wherein the cladding material completely surrounds the core material in the channel region;
   a gate stack disposed on the channel region, the gate stack comprising a gate dielectric and a gate electrode.

8. The apparatus of claim 7, wherein an amount of cladding material relative to an amount of core material is greater in the channel region than in the junction regions.

9. The apparatus of claim 7, wherein the cladding material comprises germanium and the core material comprises silicon.

10. The apparatus of claim 7, wherein the cladding material comprises a group III-V compound semiconductor material.

\* \* \* \* \*